United States Patent
Pentakota et al.

(10) Patent No.: US 12,206,427 B2
(45) Date of Patent: Jan. 21, 2025

(54) LOOKUP TABLE FOR NON-LINEAR SYSTEMS

(71) Applicant: Texas Instruments Incorporated, Dallas, TX (US)

(72) Inventors: Visvesvaraya Appala Pentakota, Bangalore (IN); Srinivas Kumar Reddy Naru, Bangalore (IN); Chirag Shetty, Bangalore (IN); Eeshan Miglani, Bangalore (IN); Neeraj Shrivastava, Bangalore (IN); Narasimhan Rajagopal, Chennai (IN); Shagun Dusad, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/588,493

(22) Filed: Jan. 31, 2022

(65) Prior Publication Data

US 2022/0247421 A1    Aug. 4, 2022

(30) Foreign Application Priority Data

Feb. 1, 2021    (IN) .............................. 202141004288

(51) Int. Cl.
     *H03M 1/10*      (2006.01)
(52) U.S. Cl.
     CPC ................................ *H03M 1/1038* (2013.01)
(58) Field of Classification Search
     CPC .. H03M 1/1038; H03M 1/365; H03M 1/0624; H03M 1/0836
     See application file for complete search history.

(56) References Cited

U.S. PATENT DOCUMENTS

| | | | |
|---|---|---|---|
| 4,612,533 | A | 9/1986 | Evans |
| 4,899,071 | A | 2/1990 | Morales |
| 4,928,103 | A | 5/1990 | Lane |
| 5,317,721 | A | 5/1994 | Robinson |
| 5,495,247 | A | 2/1996 | Yamamoto et al. |
| 5,563,533 | A | 10/1996 | Cave et al. |
| 5,821,780 | A | 10/1998 | Hasegawa |

(Continued)

FOREIGN PATENT DOCUMENTS

| | | |
|---|---|---|
| CN | 111064468 A | 4/2020 |
| EP | 3716486 A1 | 9/2020 |

(Continued)

OTHER PUBLICATIONS

International Search Report in corresponding PCT Patent Application No. PCT/2021-063021, dated Mar. 31, 2022 (3 pages).

(Continued)

*Primary Examiner* — Jean B Jeanglaude
(74) *Attorney, Agent, or Firm* — John R. Pessetto; Frank D. Cimino

(57) ABSTRACT

In described examples, a circuit includes a multiplexer. The multiplexer receives an input voltage and a calibration signal. An analog-to-digital converter (ADC) is coupled to the multiplexer and generates an output code in response to the calibration signal. A storage circuit is coupled to the ADC and stores the input code representative of the calibration signal at an address corresponding to the output code. The stored input code includes an index value and a coarse value.

15 Claims, 6 Drawing Sheets

(56) References Cited

U.S. PATENT DOCUMENTS

| | | |
|---|---|---|
| 6,002,352 A | 12/1999 | El-Ghoroury et al. |
| 6,046,612 A | 4/2000 | Taft |
| 6,060,912 A | 5/2000 | Opris |
| 6,069,579 A | 5/2000 | Ito et al. |
| 6,124,746 A | 9/2000 | Van Zalinge |
| 6,144,231 A | 11/2000 | Goldblatt |
| 6,314,149 B1 | 11/2001 | Daffron |
| 6,377,200 B1 | 4/2002 | Lee |
| 6,556,060 B1 | 4/2003 | Dillon |
| 6,590,517 B1 | 7/2003 | Swanson |
| 6,661,365 B1 | 12/2003 | Bugeja |
| 6,720,895 B2 | 4/2004 | Poulton et al. |
| 6,822,596 B2 | 11/2004 | Theiler |
| 6,836,127 B2 | 12/2004 | Marshall |
| 6,857,002 B1 | 2/2005 | Thomsen |
| 7,046,179 B1 | 5/2006 | Taft et al. |
| 7,142,138 B2 | 11/2006 | Chen et al. |
| 7,233,172 B2 | 6/2007 | Kanamori et al. |
| 7,262,724 B2 | 8/2007 | Hughes et al. |
| 7,379,007 B2 | 5/2008 | Noguchi |
| 7,379,010 B2 | 5/2008 | Tero |
| 7,405,689 B2 | 7/2008 | Kernahan et al. |
| 7,446,573 B1 | 11/2008 | Miller |
| 7,501,862 B2 | 3/2009 | Su et al. |
| 7,525,471 B2 | 4/2009 | Prodic et al. |
| 7,557,746 B1 | 7/2009 | Waltari |
| 7,737,875 B2 | 6/2010 | Waltari et al. |
| 7,738,265 B2 | 6/2010 | Trattler |
| 7,839,323 B2 | 11/2010 | Kidambi |
| 7,847,576 B2 | 12/2010 | Koiima |
| 7,884,748 B2 | 2/2011 | Dekagbes |
| 7,916,064 B2 | 3/2011 | Lin et al. |
| 7,919,994 B2 | 4/2011 | Walker |
| 8,089,388 B2 | 1/2012 | Cui et al. |
| 8,130,130 B2 | 3/2012 | Danjo et al. |
| 8,183,903 B2 | 5/2012 | Glass et al. |
| 8,373,444 B2 | 2/2013 | Lee et al. |
| 8,421,664 B2 | 4/2013 | Ryu et al. |
| 8,514,121 B1 | 8/2013 | Shu |
| 8,558,725 B2 | 10/2013 | Kidambi |
| 8,773,169 B2 | 7/2014 | Dinc et al. |
| 8,810,282 B2 | 8/2014 | Li |
| 8,836,375 B2 | 9/2014 | Ghatak |
| 8,896,476 B2 | 11/2014 | Harpe |
| 9,350,374 B2 | 5/2016 | Sundblad et al. |
| 9,369,137 B2 | 6/2016 | Masuko |
| 9,379,007 B2 | 6/2016 | Arvin |
| 9,455,695 B2 | 9/2016 | Kull et al. |
| 9,467,160 B2 | 10/2016 | Chang |
| 9,503,116 B2 | 11/2016 | Speir et al. |
| 9,548,752 B1 | 1/2017 | Shrivastava et al. |
| 9,559,716 B1 | 1/2017 | Matsui et al. |
| 9,685,971 B2 | 6/2017 | Harada |
| 9,742,424 B2 | 8/2017 | Sharma et al. |
| 9,917,590 B2 | 3/2018 | Zhang et al. |
| 10,003,353 B2 | 6/2018 | Kris et al. |
| 10,103,753 B1 | 10/2018 | Nagarajan et al. |
| 10,284,187 B1 | 5/2019 | K |
| 10,284,188 B1 | 5/2019 | Soundarajan et al. |
| 10,673,452 B1 | 6/2020 | Soundararajan |
| 10,673,453 B1 | 6/2020 | Pentakota |
| 10,673,456 B1 | 6/2020 | Dusad et al. |
| 10,778,243 B2 | 9/2020 | Pentakota et al. |
| 10,840,934 B2 | 11/2020 | Benjaram et al. |
| 10,958,258 B2 | 3/2021 | Soundararajan et al. |
| 11,316,525 B1 | 4/2022 | Pentakota |
| 11,316,526 B1 * | 4/2022 | Rajagopal ............. H03M 1/502 |
| 2005/0104626 A1 | 5/2005 | Wakamatsu et al. |
| 2006/0158365 A1 | 7/2006 | Kernahan et al. |
| 2006/0220935 A1 | 10/2006 | Hughes et al. |
| 2008/0297381 A1 | 12/2008 | Kernahan et al. |
| 2009/0153388 A1 | 6/2009 | Waltari et al. |
| 2009/0243907 A1 | 10/2009 | Nazemi |
| 2009/0302888 A1 | 12/2009 | Shumarayev et al. |
| 2010/0085101 A1 | 4/2010 | Walker |
| 2010/0085232 A1 | 4/2010 | Nicolas |
| 2010/0245149 A1 | 9/2010 | Danjo |
| 2011/0109348 A1 | 5/2011 | Chen |
| 2011/0109488 A1 | 5/2011 | Nakajima |
| 2011/0234440 A1 | 9/2011 | Danjo |
| 2012/0105264 A1 | 5/2012 | Ryu et al. |
| 2012/0176158 A1 | 7/2012 | Lee et al. |
| 2012/0212358 A1 | 8/2012 | Shi et al. |
| 2012/0326904 A1 | 12/2012 | Jensen |
| 2013/0009796 A1 | 1/2013 | Sakiyama et al. |
| 2013/0021118 A1 | 1/2013 | Kabir et al. |
| 2013/0021189 A1 | 1/2013 | Kabir |
| 2013/0106632 A1 | 5/2013 | Petigny et al. |
| 2013/0169463 A1 | 7/2013 | Stein et al. |
| 2014/0361917 A1 | 12/2014 | Matsuno et al. |
| 2015/0008894 A1 | 1/2015 | Cannankurichi et al. |
| 2015/0244386 A1 | 8/2015 | El Chammas |
| 2015/0260552 A1 | 9/2015 | Yao et al. |
| 2017/0117914 A1 | 4/2017 | Choi |
| 2017/0214411 A1 | 7/2017 | Liu |
| 2017/0230034 A1 | 8/2017 | Wei |
| 2019/0007071 A1 | 1/2019 | Nagarajan et al. |
| 2019/0131997 A1 | 5/2019 | Liu |
| 2019/0280703 A1 | 9/2019 | Naru et al. |
| 2019/0296756 A1 | 9/2019 | Ali |
| 2020/0195268 A1 | 6/2020 | Soundarajan et al. |
| 2020/0204184 A1 | 6/2020 | Rattan |
| 2020/0259501 A1 | 8/2020 | Pentakota |
| 2020/0259502 A1 | 8/2020 | Dusad et al. |
| 2020/0403632 A1 | 12/2020 | Chen et al. |
| 2021/0126644 A1 | 4/2021 | Sharma et al. |
| 2021/0359694 A1 | 11/2021 | Chen et al. |
| 2022/0224349 A1 | 7/2022 | Varshney et al. |
| 2022/0247421 A1 | 8/2022 | Pentakota et al. |
| 2022/0294461 A1 | 9/2022 | Huynh |

FOREIGN PATENT DOCUMENTS

| | | |
|---|---|---|
| JP | H05206801 | 8/1993 |
| KR | 20000028857 | 5/2000 |
| KR | 20000028857 A | 5/2000 |
| KR | 2001044806 | 2/2001 |
| KR | 20020015863 | 3/2002 |
| WO | 2004038922 | 5/2004 |
| WO | 2020233818 A1 | 11/2020 |

OTHER PUBLICATIONS

International Search Report in corresponding PCT Patent Application No. PCT/2021-064260, dated Apr. 7, 2022 (3 pages).

International Search Report in corresponding PCT Patent Application No. PCT/2022-012066, dated Apr. 7, 2022 (2 pages).

International Search Report in corresponding PCT Patent Application No. PCT/2022-013802, dated Apr. 28, 2022 (2 pages).

International Search Report in corresponding PCT Patent Application No. PCT/2022-014532, dated May 5, 2022 (2 pages).

U.S. Appl. No. 16/517,796, Notice of Allowance, dated Feb. 6, 2020, p. 7.

U.S. Appl. No. 16/410,698, Notice of Allowance, dated Feb. 10, 2020, p. 6.

International Search Report in corresponding PCT Patent Application No. PCT/2018-068162, dated Apr. 25, 2019 (2 pages).

U.S. Appl. No. 17/158,526, Notice of Allowance, dated Jan. 14, 2022, p. 8.

Extended European Search report for corresponding EP Application No. 21911890.8, dated Jan. 31, 2024, 19 pgs.

Extended European Search report for corresponding EP Application No. 21911951.8, dated Jan. 22, 2024, 11 pgs.

Wu Tzu-Fan et al: "A Flash-Based Non-Uniform Sampling ADC With Hybrid Quantization Enabling Digital Anti-Aliasing Filter", IEEE Journal of Solid-State Circuits, IEEE, USA, vol. 52, No. 9, Sep. 1, 2017 (Sep. 1, 2017), pp. 2335-2349, XP011659292, ISSN: 0018-9200, DOI: 10.1109/JSSC.2017.2718671 [retrieved on Aug. 23, 2017].

Yi Il-Min et al: "A 4-GS/s 11.3-mW 7-bit Time-Based ADC With Folding Voltage-to-Time Converter and Pipelined TDC in 65-nm

(56) References Cited

OTHER PUBLICATIONS

CMOS", IEEE Journal of Solid-State Circuits, IEEE, USA, vol. 56, No. 2, Oct. 5, 2020 (Oct. 5, 2020), pp. 465-475, XP011834558, ISSN: 0018-9200, DOI: 10.1109/JSSC.2020.3025605.

Zhang Minglei et al: "An 8-Bit 10-GS/s 16x Interpolation-Based Tim••Domain ADC With 1.5-ps Uncalibrated Quantization Steps", IEEE Journal of Solid-State Circuits, IEEE, USA, vol. 55, No. 12, Aug. 11, 2020 (Aug. 11, 2020), pp. 3225-3235, XP011821781, ISSN: 0018-9200, DOI: 10.1109/JSSC.2020.3012776 [retrieved on Nov. 23, 2020].

Extended European Search report for T91430EP01.

Liu Haizhu et al: "A high linear voltage-to-time converter (VTC) with 1.2V input range for time-domain analog-to-digital converters", Microelectronics Journal, vol. 88, pp. 18-24, XP085695194, ISSN: 0026-2692, DOI: 10.1016/J.MEJ0.2019.04.00.

Notice of Allowance in corresponding U.S. Appl. No. 17/182,339, Apr. 24, 2024, 17 pgs.

Notice of Allowance in corresponding U.S. Appl. No. 17/182,339, dated Jun. 26, 2024, 108 pgs.

Extended European Search report for T100164EP01.

Extended European Search report for T100165EP01.

\* cited by examiner

LOOKUP TABLE FOR NON-LINEAR SYSTEMS

CROSS REFERENCES TO RELATED APPLICATIONS

This application claims priority from India provisional patent application No. 202141004288 filed on Feb. 1, 2021 which is hereby incorporated by reference in its entirety.

TECHNICAL FIELD

This description relates generally to analog-to-digital converters, and more particularly to the usage of a lookup-table (LUT) in ADCs.

BACKGROUND

In many electronic devices, an analog input voltage is converted to a digital output signal using an analog-to-digital converter (ADC). The ADC used for digitizing a signal in a radio-frequency (RF) sampling receiver may be required to operate at high speeds. Such speeds may be in the order of giga samples per second (GSPS). However, for ADCs operating at such high speeds, there is a need to correct the non-linearity of the high-speed ADCs.

SUMMARY

In described examples, a circuit includes a multiplexer. The multiplexer receives an input voltage and a calibration signal. An analog-to-digital converter (ADC) is coupled to the multiplexer and generates an output code in response to the calibration signal. A storage circuit is coupled to the ADC and stores an input code representative of the calibration signal at an address corresponding to the output code. The stored input code includes an index value and a coarse value.

The present disclosure also relates to a method that includes receiving an input voltage and a calibration signal, generating an output code by an analog-to-digital converter (ADC) in response to the calibration signal, and storing an input code representative of the calibration signal at an address corresponding to output code, the stored input code includes an index value and a coarse value.

The present disclosure also relates to a device that includes a processor, a memory coupled to the processor, and a circuit coupled to the processor and the memory. The circuit includes a multiplexer. The multiplexer receives an input voltage and a calibration signal. An analog-to-digital converter (ADC) is coupled to the multiplexer and generates an output code in response to the calibration signal. A storage circuit is coupled to the ADC and stores an input code representative of the calibration signal at an address corresponding to the output code. The stored input code includes an index value and a coarse value.

BRIEF DESCRIPTION OF THE DRAWINGS

The same reference numbers or other reference designators are used in the drawings to designate the same or similar (functionally and/or structurally) features.

DETAILED DESCRIPTION OF EXAMPLE EMBODIMENTS

Commonly-assigned patent application entitled "Calibration Scheme for a Non-Linear ADC" (TI-100164) filed on Jan. 5, 2022 and assigned Ser. No. 17/568,972 is hereby incorporated by reference in its entirety.

Figure 1:
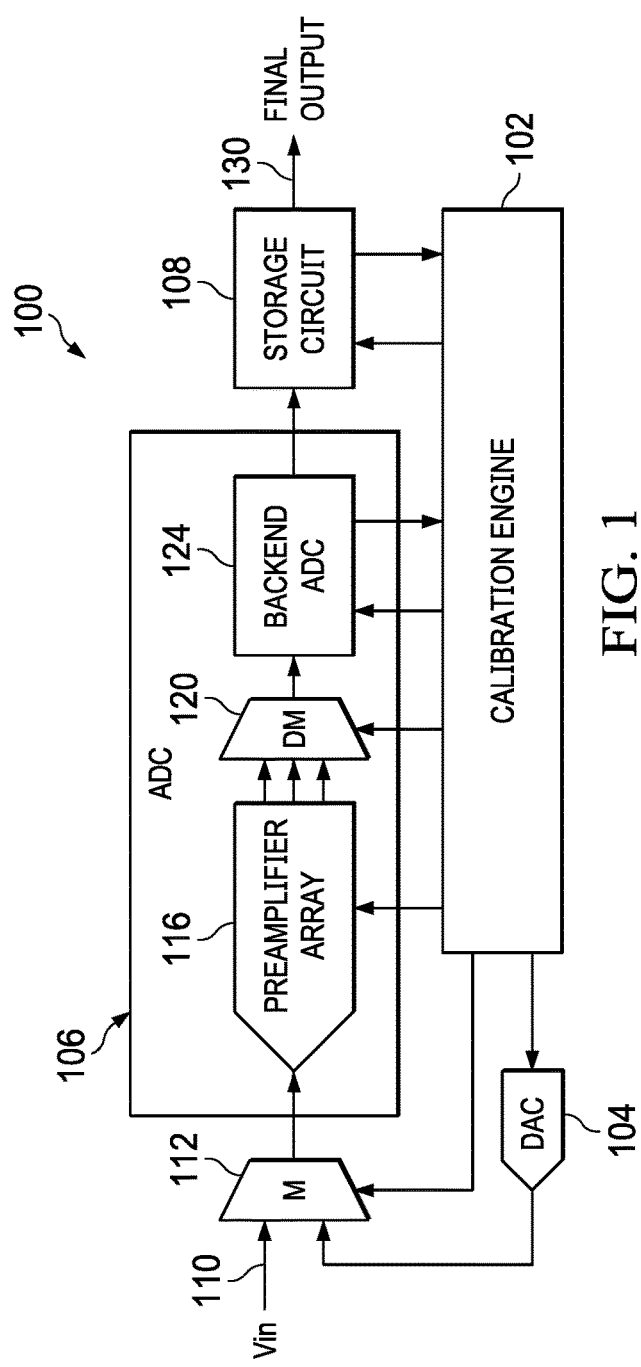
FIG. 1 is a block diagram of a circuit, according to an example embodiment.

FIG. 1 is a block diagram of a circuit 100, according to an example embodiment. The circuit 100 includes a calibration engine 102, a digital-to-analog converter (DAC) 104, an analog-to-digital converter (ADC) 106 and a storage circuit 108. The DAC 104 is coupled to the calibration engine 102. The ADC 106 is coupled to the calibration engine 102, the storage circuit 108, and the DAC 104 (via a multiplexer M 112). The storage circuit 108 is also coupled to the calibration engine 102. In an example embodiment, storage circuit 108 may implement a LUT (look-up table).

The multiplexer M 112 is coupled between the DAC 104 and the ADC 106. The multiplexer M 112 is also coupled to the calibration engine 102. The multiplexer M 112 receives an input voltage Vin 110, and selectively outputs the input voltage Vin 110 or an output of the DAC 104. The ADC 106 includes a preamplifier array 116, a delay multiplexer DM 120 and a backend ADC 124. The preamplifier array 116 is coupled to the multiplexer M 112 and includes multiple preamplifiers. The delay multiplexer DM 120 is coupled to the preamplifier array 116. The backend ADC 124 is coupled to the delay multiplexer DM 120. The storage circuit 108 is coupled to the backend ADC 124. The storage circuit 108 may be constructed of digital memory circuits (e.g. RAM, ROM), registers, and/or flip-flops. The storage circuit 108 may be part of a conventional memory circuit or part of digital processor system. The calibration engine 102, in one example, is or is a part of, a processing unit, a digital signal processor (DSP), a processor and/or a programmable logic device. The calibration engine 102 may include memory and logic. In some example embodiments, the ADC 106 may be implemented as a voltage-to-delay converter ("V2D"). Examples of such V2D converters are described in coassigned U.S. Pat. Nos. 10,284,188, 10,6733,456, 10,673,452 and 10,673,453, each of which is hereby incorporated by references in its entirety.

In some example embodiments, each of the components of the ADC 106 are capable of communicating with the calibration engine 102 independently, and with other components of the circuit 100. However, these connections are not discussed herein for simplicity. Each block or component of the circuit 100 may also be coupled to other blocks in FIG. 1, but those connections are not described herein for brevity. The circuit 100 may include one or more conventional components that are not described herein for simplicity of the description.

The circuit 100, in one example, is an analog-to-digital converter. The circuit 100 operates in a calibration mode and a mission mode (also referred to as a "normal" mode of operation). In the calibration mode, the calibration engine 102 generates multiple input codes, where each input code corresponds to a known analog voltage. The DAC 104 generates calibration signals (e.g. analog voltages) in response to the multiple input codes. For example, the DAC 104 generates a first calibration signal in response to a first input code of the multiple input codes. The multiplexer M 112, in calibration mode, provides the first calibration signal to the ADC 106. The preamplifier array 116 and the delay multiplexer DM 120 generate a delay signal in response to the first calibration signal. In one example, the delay signal represents a value of the analog input signal based on the amount of delay in the generated signal(s). The backend ADC 124 generates a first output code in response to the delay signal. The storage circuit 108 stores the first output code corresponding to the first input code. The storage circuit 108 stores an output code corresponding to each input code of the multiple input codes. In one example embodiment, the storage circuit 108 maintains a look-up table (LUT) to store an output code corresponding to each input code. In an example embodiment, the output of ADC 106 ("ADC Raw Code") may be M bits and the output of storage circuit 108 ("Corrected Output") may be N bits.

Similarly, the DAC 104 generates a second calibration signal in response to a second input code (of the multiple input codes) generated by the calibration engine 102. The preamplifier array 116 and the delay multiplexer 120 generates a delay signal in response to the second calibration signal. The backend ADC 124 generates a second output code in response to the delay signal. The storage circuit 108 stores the second output code corresponding to the second input code. The first output code is stored in a first location in the storage circuit 108, and the second output code is stored in a second location in the storage circuit 108. Thus, for each input code generated by the calibration engine 102, an output code is stored in the look-up table in the storage circuit 108. The look-up table in the storage circuit 108 is populated in the calibration mode with the input codes and the corresponding output codes. This look-up table is used by the circuit 100 in mission mode, as discussed later in the detailed description.

Table 1 below is an example to illustrate the operation of the circuit 100 while operating in the calibration mode. The Table 1 illustrates input codes generated by the calibration engine 102 and the corresponding output codes generated by the ADC 106 and stored in the look-up table in the storage circuit 108.

TABLE 1

| Input Code (Address) | Output code (Data) |
|---|---|
| 0 | 0 |
| 1 | 8 |
| 2 | 10 |
| 3 | 11 |
| 4 | 15 |
| ... | ... |
| ... | ... |
| 8191 | 32700 |

As illustrated in Table 1, for input code 0 generated by the calibration engine 102, an output code 0 is stored in the storage circuit 108. Similarly, for input code 2, the output code is 10 which is stored in the storage circuit 108. The storage circuit 108 stores output codes for each input code generated by the calibration engine 102. It is understood that both the input code and output codes are stored and processed in binary format in the circuit 100, and decimal values are discussed for ease of understanding. In one example, each input code is N bits and each output code is of N+n bits, where both N and n are integers and greater than zero. This mitigates the non-linearity of the ADC 106. As illustrated in Table 1, when N is 13, the look-up table in the storage circuit 108 stores ($2^N$) output codes (8191) corresponding to ($2^N$) input codes. In Table 1, N is 13 and n is 2, and hence a range of output codes stored in the storage circuit 108 varies from 0 to 32767 (e.g., a total of 32768 ($2^{13+2}$)). In Table 1, the input code is the address and the output code is the data. The advantage of having a look-up table as illustrated in Table 1 is the reduced memory requirement. The memory requirement of the look-up table is approximately 120 k ($2^{13}*15=2^N*(N+n)$=Number of storage locations times the number of bits of data). However, the look-up table, as illustrated in Table 1, is more suitable for low speed operation of circuit 100.

A solution to overcome this problem is to populate the look-up table illustrated in Table 1 in an inverse manner (where the address for each stored value is provided by the output code). This is illustrated in Table 2, which is another example to illustrate the operation of the circuit 100 while operating in the calibration mode. The Table 2 illustrates input codes generated by the calibration engine 102 and the output codes generated by the backend ADC 124 corresponding to the input codes.

TABLE 2

| Output code (Address) | Input Code (Data) |
|---|---|
| 0 | 0 |
| 1 | 0 |
| 2 | 0 |
| 3 | 0 |
| 4 | 0 |
| 5 | 0 |
| 6 | 0 |
| 7 | 0 |
| 8 | 1 |
| 9 | 1 |
| 10 | 2 |
| 11 | 3 |
| 12 | 3 |

TABLE 2-continued

| Output code (Address) | Input Code (Data) |
|---|---|
| 13 | 3 |
| 14 | 3 |
| 15 | 4 |
| ... | ... |
| ... | ... |
| 32700 | 8191 |

As illustrated in Table 2, for input code 0, an output code 0 is generated, and the input code (1 is stored in the storage circuit 108 at the address of the output code, which is 0. Similarly, for input code 1, the output code generated is 8. The input code 1 is stored in the storage circuit 108 at the corresponding address of the output code, which is 8. Thus, in Table 2, the input code is the data and the output code is the address. As compared to the look-up table illustrated in Table 1, the look-up table illustrated in Table 2 enables high speed operation of the circuit 100. However, the look-up table, as illustrated in Table 2, requires increased memory area in the storage circuit 108. The memory requirement of the look-up table is approximately 420 k ($2^{15}*13=2^{N+n}$(N), where N is 13 and n is 2).

To reduce the memory requirement in the storage circuit 108, and to enable the circuit 100 for high speed operation, the following scheme is used in some example embodiments. Table 3 below is an example to illustrate the operation of the circuit 100 while operating in the calibration mode. Table 3 illustrates input code generated by the calibration engine 102 and the output code generated by the backend ADC 124 corresponding to the input code. In the example embodiment illustrated in Table 3, a value of "0" (e.g. a logic low or a logic 0) or "1" (e.g. a logic high or a logic "1") is stored in each location for an input code. A value of "1" designates that the input code is increased by one (with respect to the previously stored value for the input code), while a value of "0" designates that the input code is the same as the previous value for the input code.

TABLE 3

| Output code | Input Code |
|---|---|
| 0 | 0 |
| 1-7 | 0 |
| 8 | 1 |
| 9 | 0 |
| 10 | 1 |
| 11 | 1 |
| 12-14 | 0 |
| 15 | 1 |
| ... | ... |
| 32700 | 1 |

As illustrated in Table 3, for input code 0, an output code 0 is generated, and the input code 0 is stored in the storage circuit 108 at the address of the output code, which is 0. Similarly, the input code, corresponding to output codes 1 through 7, remains 0. Thus, the input codes that correspond to storage locations 1-7 remain "0". However, when the input code is 1, the output code is 8. Since, the input code is 1 greater than the input codes that correspond to output codes 0-7, the input code corresponding to address 8 (value of the output code) is a "1". Since the output code is 9 when the input code is a 1, a value of "0" is stored at address 9 because the input code is the same as the previous input code (e.g. the input code corresponding to the output code 8). When the input code is 2 the output code is 10. Since the input code increased (compared to the input code corresponding to the input code for output code 9), the value stored at address 10 is a "1". In Table 3, similar to Table 2, the input code is the data and the output code is the address. To calculate an output code for a particular input code, the input codes at all memory locations before the input code that corresponds to the specific output code needs to be summed. For example, when output code is 10, the sum of all the input codes to the current address (or the output code 10) is 2. Thus, the look-up table enables high speed operation of the circuit 100. However, this solution would require large computation power as summing operation needs to be performed for each memory location. The memory requirement of look-up table in Table 3 is approximately 32 k ($2^{15}=2^{N+n}$, where N is 13 and n is 2).

To enable high speed operation of the circuit 100, the following scheme is used. Table 4 below is an example to illustrate the operation of the circuit 100 while operating in the calibration mode. Table 4 illustrates input code generated by the calibration engine 102 and the output code generated by the backend ADC 124 corresponding to the input code. As discussed with reference to Tables 2 and 3, the output code is the address for the corresponding input code (data).

TABLE 4

| Output code | Input Code |
|---|---|
| 0 | 0 :0000X |
| 8 | 1 :0001X |
| 9 | 0:0001X |
| 10 | 1 :0002X |
| 11 | 1: 0003X |
| 12-14 | 0:0003X |
| 15 | 1: 0004X |
| ... | ... |
| ... | ... |
| 32700 | 1:1FFFX |

Similar to Tables 1-3, in Table 4 as well, for input code 0, an output code 0 is generated, and for input code 1, output code 8 is generated. The input code is stored as data and the output code is stored as an address e.g., the input code is stored at a corresponding address of the output code. The stored input code includes an index value and a coarse value (e.g., a running sum of the index values). The index values are represented in Table 4 (in the column for input codes) as '0', '1', '0' and so on, and the coarse values are represented as '0000X', '0001X' and so on. Similar to the values for input code in Table 3, the index value is 1 when an input code corresponding to a current output code is not equal to an input code corresponding to a previous output code. The index value is 0 when an input code corresponding to the current output code is equal to an input code corresponding to the previous output code. For example, as illustrated in Table 2, the input code is 0 for all output codes from 1 to 7. When output code is 8, input code is 1. Hence, the index value remains 0 for output codes 1 to 7, and index value is 1 when output code is 8. The index value is 1 whenever the input code corresponding to the current output code (for example output code 8) is not equal to the input code corresponding to the previous output code (for example output code 7).

The coarse value for a current output code is a sum of index values generated corresponding to all previous output codes in addition to the index value corresponding to the current output code. The coarse value represents the running sum of input codes. For example, the coarse value for a current output code (for example output code 10) is the sum of all index value generated corresponding to all previous output codes (for example index values generated corresponding to the output codes from 1 to 9) and the index value corresponding to the current output code (for example output code 10). The sum of all index values up to output code 10 is 0002. The memory requirement of the look-up table of Table 4 is approximately 450 k ($2^{15}*14 = 2^{N+n}$*Number of bits stored for each input code, where N is 13 and n is 2).

To further refine the look-up table illustrated in Table 4, the following example embodiment illustrated in Table 5 may be used. The output code includes a total of M (e.g. most significant) and L (e.g. least significant) bits, where both M and L are integers greater than or equal to 1. The output code is reduced to M bits, and the index value is supplemented with L bits. The reduced output code is referred as a block index (BI). The coarse value is stored for every 2^L (e.g., $2^L$) bits. For example, when (as described above with reference to Tables 1-4) the output code is of 15 bits (N+n), M is 10 bits and L is 5 bits. The output code is reduced to 10 bits whereas the index value is supplemented by 5 bits. This is represented in Table 5 below. Thus, the reduced output code is the block index (BI) which extends from 0 to 1023 ($2^{10}$) and the index value is 32 bits ($2^5$). The coarse value is stored for every 32 bits, for example, for every block index. The coarse value represents the running sum of the input codes.

TABLE 5

| Block Index | Input Code | |
|---|---|---|
| (BI) | Index Value | Coarse Value |
| 0 | 0000 0000 1011 0000 0010 0000 0100 0000 | 0 |
| 1 | 1000 0001 1100 0011 0111 0000 0100 0010 | 5 |
| 2 | 0000 0111 0100 0101 1111 1000 1110 0100 | 16 |
| . . . | | . . . |
| 1023 | 0100 1000 0001 0011 0101 1010 1100 0101 | 7024 |

The input code is generated by the calibration engine 102 and the output code (corresponding to the input code) is generated by the backend ADC 124. Similar to Table 4, in Table 5, for input code 0, an output code 0 is generated, and for input code 1, output code 8 is generated. The input code is stored as data and the output code is stored as address. The stored input code includes the index value and the coarse value. Similar to the embodiments described with reference to Tables 2-4, the index value is 1 when an input code corresponding to a current output code is not equal to an input code corresponding to a previous output code. The index value is 0 when an input code corresponding to the current output code is equal to an input code corresponding to the previous output code. As illustrated in Table 5 (and referring to Table 4), the index value is 0 when output code is 0 and the index value continues to be 0 for output codes 1 to 7. When the output code is 8, the index value is 1. Similarly, the index value is 1 when the output code is 10 and index value is 1 when the output code is 11.

The coarse value is stored for every 32 bits of index value. Thus, the coarse value is stored for each block index. The coarse value is the sum of all index values generated corresponding to all previous block indexes. For example, the coarse value is 0 when the BI is 0, and when the BI is 1, the coarse value is 5 which is the sum of all index values generated corresponding to BI 0. Similarly, when BI is 2, the coarse value is 16 which is sum of all index values generated corresponding to BI 0 and 1. The memory requirement of the look-up table of Table 5 is approximately 45 k ($2^{10}*(32+13) = 2^M*(2^L+N)$).

Thus, the look-up table represented in Table 5 requires less memory as compared to conventional solutions and also support high speed operation of the circuit 100. The circuit 100, in one example embodiment, is an ADC, and the look-up table as illustrated in Table 5 enables the ADC to operate at speeds of GSPS. Thus, the look-up table in the storage circuit 108 is populated in the calibration mode with the input codes and corresponding output codes as illustrated in Table 5. This look-up table is used by the circuit 100 in mission mode, as discussed in the next paragraph.

In the mission mode, the multiplexer M 112 provides the input voltage Vin 110 to the multiplexer M 112. The multiplexer M 112, in one example embodiment, is controlled by the calibration engine 102. The combination of the preamplifier array 116 and the delay multiplexer DM 120 generates a delay signal in response to the input voltage Vin 110. The backend ADC 124 generates a raw code (ADC raw code) in response to the delay signal. An input code stored at an address corresponding to the raw code in the look-up table (similar to look-up table represented in Table 5) in the storage circuit 108 is generated as a final output 130 (corrected output) by the circuit 100. For each value of the input voltage Vin 110, the raw code is matched to an address of the output code, and the input code stored at the address is provided as the final output 130. Thus, the mission mode represents, in one version, normal operation of the circuit 100 in which an analog signal (such as a radio frequency analog signal) is received as Vin 110 and converted to a digital (e.g. binary) representation via the ADC 106 and the storage circuit 108. The final output 130 is thus a digital representation of the analog signal Vin 110.

The multiplexer M 112, the ADC 106 and the storage circuit 108 form one channel in the circuit 100. The circuit 100 can be implemented with two or more channels. In one example embodiment, each channel may be implemented in parallel with other channels. A second channel would include a second multiplexer (e.g., similar to multiplexer 112), a second ADC (e.g., similar to ADC 106) and a second storage circuit (e.g., similar to storage circuit 108). A second backend ADC in the second channel may be similar to the backend ADC 124 in the first channel but both are calibrated separately as both may have different transfer functions because of manufacturing variations. Multiple channels allow the flexibility to have one channel in calibration mode and the other channels operate in mission mode. Thus, when one channel is being calibrated, other channels are used in mission mode for analog-to-digital conversion. In one example, all the channels are calibrated using the DAC 104, and all channels are controlled by the calibration engine 102. In some example embodiments, there is no need to perform any matching between the channels as the backend ADC in each channel is calibrated independently. This also reduces the requirement of background estimation and calibration algorithms.

The combination of the preamplifier array 116, the delay multiplexer DM 120 and the backend ADC 124, in one example, acts as a non-linear ADC or a delay-based ADC. Though this combination is highly non-linear, the circuit 100 is highly linear and operates at high speed with relaxed area and power requirements. The circuit 100 scales well with technology nodes. The circuit 100 pushes the high linearity requirement on the DAC 104. This is advantageous because it is relatively less difficult to design and implement analog circuits for operation at lower speed with linearity and accuracy. According to the present disclosure, the backend ADC 124 may be designed to run at high speed by compromising linearity. However, with the backend ADC 124 operating in conjugation with the look-up table in the storage circuit 108, the circuit 100 behaves like a linear analog-to-digital converter (ADC). Likewise, the storage circuit 108 may be implemented in digital circuit, and be configured for high speed.

Interfacing external analog signals to fast digital processing cores generally requires an ADC. With higher speeds in transmission of data, the ADC may be required to operate at very high speeds and with a good signal-to-noise ratio. Without the benefits of some example embodiments, such constraints could result in large power dissipation and large area requirements for the supporting integrated circuit. These issues may be especially prominent at fast sampling rates (for example, sampling rates in the order of giga samples per second (GSPS)) because of analog non-idealities which may limit performance. The example embodiments of circuit 100 provides a backend ADC 124 with the lookup-table approach that can open up wide architectures using one or more non-linear ADCs but can be calibrated to provide the superior performance of a highly linear ADC.

In calibration mode, the look-up table in the storage circuit 108 is populated as illustrated in Table 5, and in mission mode, the circuit 100 uses high speed ADC 106 and the storage circuit 108 to generate an output code corresponding to the input voltage Vin 110. Hence, the circuit 100 does not use any complex algorithms or hardware for digital conversion of the input voltage Vin 110. This reduces the area and power requirements of the circuit 100. Thus, the circuit 100 is capable of being used in RF sampling receivers which operate at speeds of GSPS. The circuit 100 scales well with technology nodes and is capable of supporting high GSPS transfer rates in future technology nodes.

Figure 2:
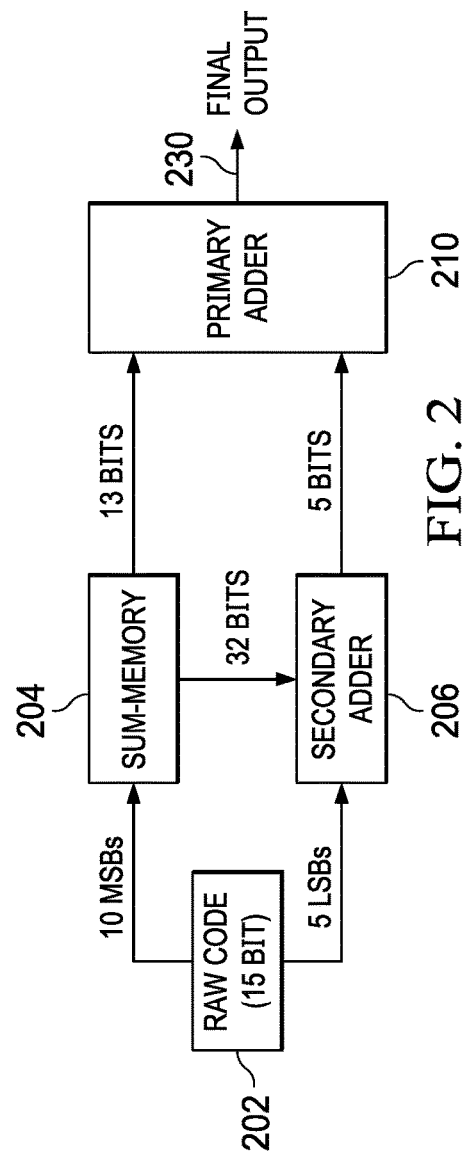
FIG. 2 is as block diagram to illustrate a method of conversion of raw data to a final output using a look-up table in a storage circuit, according to an embodiment.

FIG. 2 is as block diagram 200 to illustrate a method of conversion of raw data to a final output using a look-up table in a storage circuit, according to an embodiment. The block diagram 200 is explained in connection with circuit 100 illustrated in FIG. 1, and represents digital conversion of the input voltage Vin 110 to a final output 130. The storage circuit 108 stores data as illustrated in Table 5. In one example, a sum-memory 204, a secondary adder 206 and a primary adder 210 are part of the storage circuit 108. The raw code of 15 bits is received from the backend ADC 124. The 5 LSBs (least significant bits) are provided to the secondary adder 206, and the 10 MSBs (most significant bits) are provided to a sum-memory 204.

The sum-memory 204 determines the block index (BI) based on the MSBs, and accordingly provides the corresponding coarse value (for example, in the form of 13 bits) to the primary adder 210. The 32 index values corresponding to the BI are provided to the secondary adder 206 from the sum-memory 204. The secondary adder 206 performs an AND operation on the 32 index values and a bit-mask. The bit-mask is obtained from the 5-bit LSBs. The secondary adder 206 sums the bits obtained after the AND operation, and the summed value is provided (in form of 5 bits) to the primary adder 210. The primary adder sums the 13 bits received from the sum-memory 204 and the 5 bits received from the secondary adder 206 to generate the final output 230. This method is now explained with the help of an example using Table 5 described in connection with FIG. 1.

As an example, when the input voltage Vin 110 received is equivalent to a decimal value of 34 (this represents an analog voltage level), the raw code would be represented as 000000000100010. The first 10 bits (0000000001) are most significant bits (MSBs) and the last 5 (00010) are least significant bits (LSBs). In the sum memory 204, the block index (BI) is determined from the MSBs. The MSB 0000000001 represents the BI 1 for which the coarse value is 5 (from Table 5). The coarse value is provided to the primary adder 210 in form of 13 bits. Based on the block index (BI), the sum memory provides the 32 bits of index values to the secondary adder 206. The 32 bits provided when BI is 1 are 1000 0001 1100 0011 0111 0000 0100 0010. The secondary adder 206 performs an AND operation on the 32 bits received from sum-memory 204 and a bit-mask which, in this example, is 1110 0000 0000 0000 0000 0000 0000 0000. The bit-mask is obtained from the LSBs (e.g., the five LSBs in this example). The binary value of the five LSBs is two. Hence, the number of ones in bit-mask are the binary value of LSBs plus one (so, for example, the value is three in this example). Hence, the first three bits of bit-mask are one and the rest of the bits are zero. The bits obtained after the AND operation is summed. In this example, the summing of ANDed bits results in a sum of one. This summed value of one is provided in the form of five bits to the primary adder 210.

The primary adder 210 adds the coarse value received from the sum-memory 204 and the summed value from the secondary adder 206 to generate the final output 230. In this example, the primary adder 210 receives five from the sum-memory 204 and one from the secondary adder 206, the sum of which is six and hence the primary adder 210 generates the binary representation of six as the final output 230. The sum of index values to 34 bits (from Table 5) results in a sum of six which validates that the final output 230 generated is correct. Thus, the look-up table storage as represented in Table 5 requires less memory as compared to conventional solutions and also support high speed operation of the circuit 100. The circuit 100, in one example embodiment, is an ADC, and the look-up table as illustrated in Table 5 enables the ADC to operate at speeds of GSPS.

Figure 3:
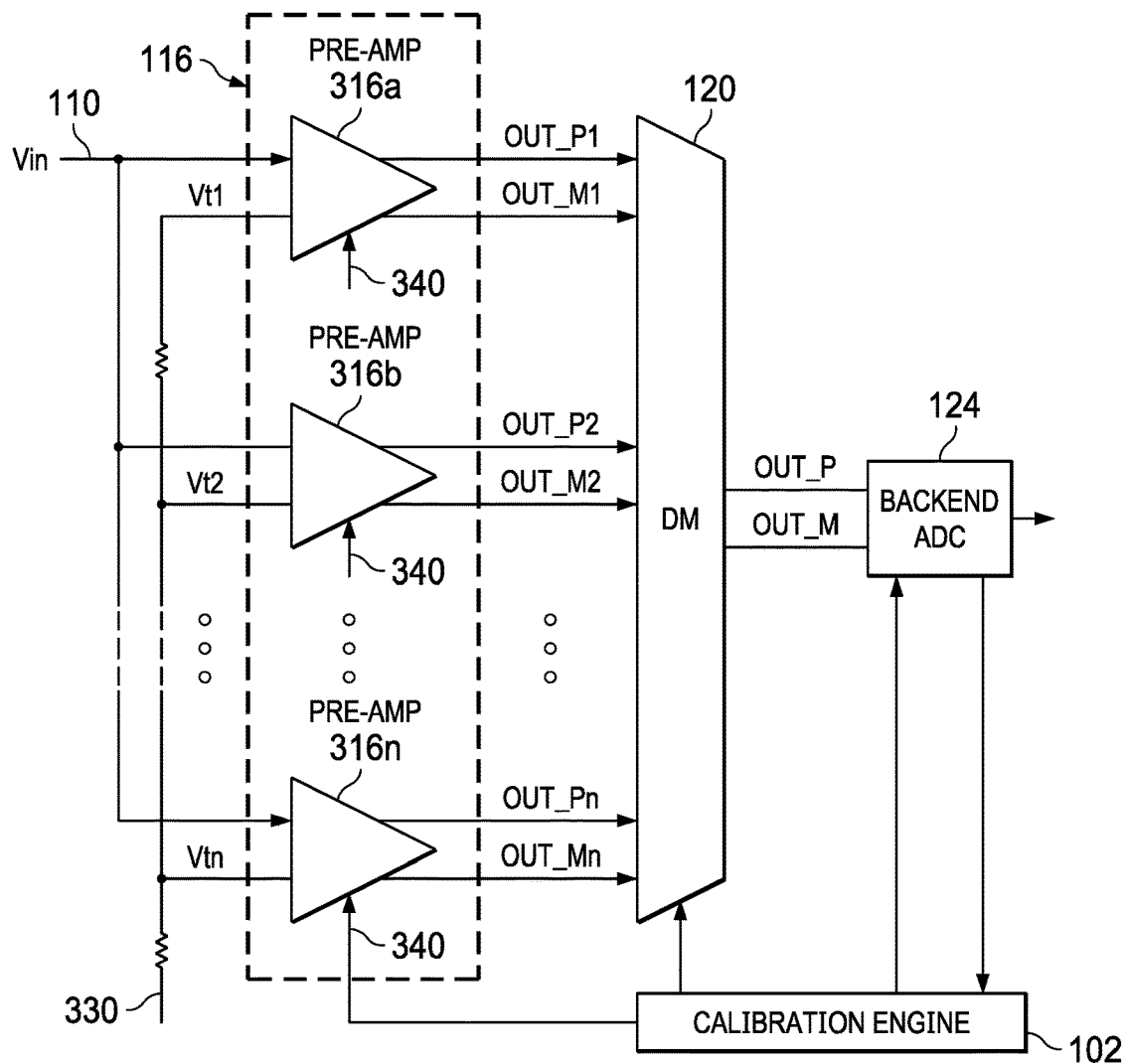
FIG. 3 is a block diagram of a portion of the circuit illustrated in FIG. 1, according to an example embodiment.

FIG. 3 is a block diagram of a portion of the circuit 100 illustrated in FIG. 1, according to an example embodiment. The preamplifier array 116 includes multiple preamplifiers from 1 to n, where n is an integer. Each of the preamplifiers having one input coupled to the input voltage Vin 110 and another input coupled to a reference voltage (such as Vt1, Vt2 . . . Vtn). These preamplifiers are labeled as, pre-amp 316a, pre-amp 316b to pre-amp 316n. The delay multiplexer DM 120 is coupled to the multiple preamplifiers in the preamplifier array 116 (via differential outputs of each preamplifier, such as OUT_P1 and OUT_M1 for pre-amp 316a). The backend ADC 124 is coupled to the delay multiplexer DM 120 by differential signal lines, OUT_P and OUT_M. The calibration engine 102 is coupled to each preamplifier in the preamplifier array 116 via input line 340, the delay multiplexer DM 120 and the backend ADC 124. The calibration engine 102 provides a timing signal to each preamplifier through input line 340, which in one example embodiment is used to reset the preamplifiers.

In operation, the preamplifier array 116 receives the input voltage Vin 110 from the multiplexer M 112. Similar to amplifiers 54-60 of U.S. Pat. No. 10,673,456 (which is hereby incorporated by reference in its entirety), each pre-amplifier receives a different threshold voltage, for example, the pre-amp 316a receives a threshold voltage Vt1, the pre-amp 316b receives a threshold voltage Vt2 and the pre-amp 316n receives a threshold voltage Vtn. In one example, Vt1<Vt2<Vtn. The threshold voltages Vt1, Vt2 to Vtn are generated using, in one example embodiment, a voltage divider 330. Each preamplifier generates a first and a second output signal based on the difference between the input voltage Vin 110 and the threshold voltage. For example, the pre-amp 316a generate differential signals—a first output signal OUT_M1 and a second output signal OUT_P1. Similarly, the pre-amp 316n generate differential signals—a first output signal OUT_Mn and a second output signal OUT_Pn.

Similar to the operation of multiplexer 211 in U.S. Pat. No. 10,673,452 (which is hereby incorporated by reference in its entirety), the delay multiplexer DM 120 receives the first and the second output signal from each preamplifier of the multiple preamplifiers. The delay multiplexer DM 120 generates a delay signal (e.g., OUT_M and OUT_P) based on an output of one of the preamplifiers. The delay signal includes a first delay signal OUT_M and a second delay signal OUT_P, and corresponds to the output signals of a preamplifier whose threshold voltage is closest to the input voltage Vin 110. For example, if the input voltage Vin 110 is closest to the threshold voltage Vt1 of the pre-amp 316a, the first delay signal OUT_M and the second delay signal OUT_P corresponds to the first and second output signals OUT_M1 and OUT_P1 of the pre-amp 316a. On the other hand, if the input voltage Vin 110 is closest to the threshold voltage Vt2 of the pre-amp 316b, the first delay signal OUT_M and the second delay signal OUT_P corresponds to the first and second output signals OUT_M2 and OUT_P2 of the pre-amp 316b. In one example, the calibration engine 102 enables the delay multiplexer DM 120 to select the output signals of a preamplifier whose threshold voltage is closest to the input voltage Vin 110. The backend ADC 124 generates a first raw code in response to the delay signal.

The preamplifiers pre-amp 316a, pre-amp 316b to pre-amp 316n within the preamplifier array 116 have varying gains (e.g. "gain" as used herein may mean voltage gain, current gain or a delay—as discussed in more detail below, amplifiers/comparators have different delays based on the input signals) as a result of various factors, which may include design, process, input voltage VIN, and/or temperature. In one example, the gains and ranges of the preamplifier pre-amp 316a, pre-amp 316b to pre-amp 316n may be adjusted, and preferably matched across the preamplifier array 116. The preamplifier array 116 and the backend ADC 124 enables the circuit 100 to operate as a high-speed and high-performance analog-to-digital converter (ADC).

Figure 4:
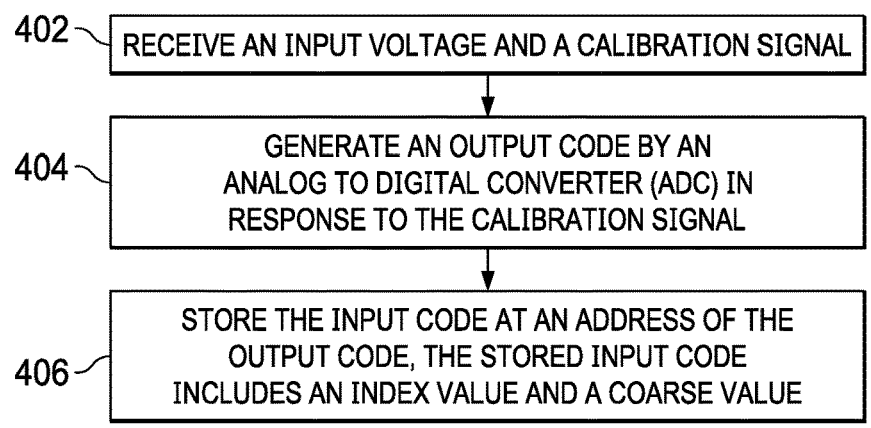
FIG. 4 is a flowchart of a method of operation of a circuit, according to an example embodiment.

FIG. 4 is a flowchart 400 of a method of operation of a circuit, according to an example embodiment. The flowchart 400 is described in connection with the circuit 100 of FIG. 1. At step 402, an input voltage and a calibration signal are received. In circuit 100, the multiplexer M 112 receives the input voltage Vin 110 and the calibration signal from the DAC 104. The circuit 100 as illustrated in FIG. 1, only contains a single channel. This single channel operates in either a calibration mode or a mission mode. In alternative embodiments, as discussed above, circuit 100 may include multiple channels (where each channel may include a multiplexer 112 and an ADC 106 and either share a calibration engine or have a dedicated calibration engine and either share a storage circuit or have a dedicated storage circuit), and each channel may operate in a mission mode and/or a calibration mode. In the calibration mode, the calibration engine 102 generates multiple input codes. The DAC 104 generates a first calibration signal in response to a first input code of the multiple input codes. At step 404, an output code is generated by an analog-to-digital converter (ADC) in response to the calibration signal. In circuit 100, the multiplexer M 112, in calibration mode, provides the first calibration signal to the ADC 106. The preamplifier array 116 and the delay multiplexer DM 120 generate a delay signal in response to the first calibration signal. The backend ADC 124 generates a first output code in response to the delay signal.

At step 406, the input code is stored at an address corresponding to the output code. The stored input code includes an index value and a coarse value. The storage circuit 108, in circuit 100, stores the first output code corresponding to the first input code. The storage circuit 108 stores an output code corresponding to each input code of the multiple input codes. In one example embodiment, the storage circuit 108 maintains a look-up table to store an output code corresponding to each input code. As discussed in connection with Table 4 and 5, the input code is stored as data and the output code is stored as address. The input code is stored at a corresponding address of the output code. The stored input code includes an index value and a coarse value.

The index value is a binary '0' when an input code corresponding to the current output code is equal to an input code corresponding to the previous output code. The coarse value for a current output code is sum of index values generated corresponding to all previous output codes and index value corresponding to the current output code. The coarse value represents running sum of input codes. Table 5 represents a look-up table in the storage circuit 108 that requires less memory as compared to conventional solutions and also support high speed operation of the circuit 100. The output code includes a total of M and L bits, where both M and L are integers greater than or equal to 1.

The output code is reduced to N bits, and the index value is supplemented with L bits. The coarse value is stored for every $2^L$ bits. For example, when the output code is of 15 bits, M is 10 bits and L is 5 bits. The output code is reduced to 10 bits whereas the index value is supplemented by 5 bits. The memory requirement of the look-up table of Table 5 is approximately 45 k ($2^{10}*(32+13)$).

Thus, the look-up table in the storage circuit 108 is populated in the calibration mode with the input codes and corresponding output codes as illustrated in Table 5. This look-up table is used by the circuit 100 in mission mode. In mission mode, an analog signal (such as a radio frequency analog signal) is received as Vin 110 and converted to a digital (e.g. binary) representation via the ADC 106 and the storage circuit 108. The circuit 100 uses a high-speed ADC and a look table in the storage circuit for conversion of the input voltage Vin which reduces the area and power requirements of the circuit 100. In one example, the circuit 100 is capable of being used in RF sampling receivers which operate at speeds of GSPS.

Figure 5:
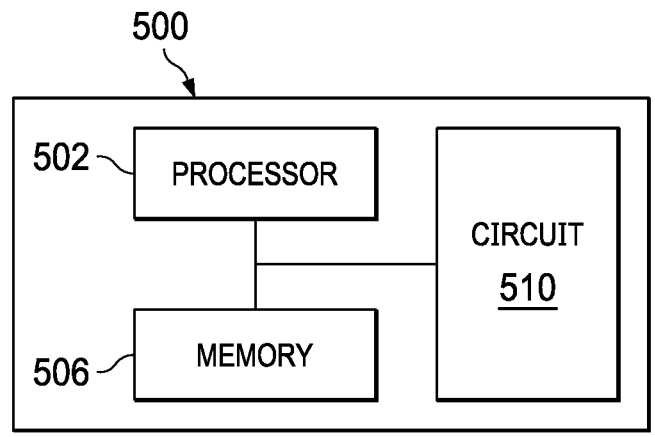
FIG. 5 is a block diagram of an example device in which several aspects of example embodiments can be implemented.

FIG. 5 is a block diagram of an example device 500 in which several aspects of example embodiments can be implemented. The device 500 is, or is incorporated into or is part of, a server farm, a vehicle, a communication device, a transceiver, a personal computer, a gaming platform, a computing device, or any other type of electronic system. The device 500 may include one or more conventional components that are not described herein for simplicity of the description.

In one example, the device 500 includes a microcontroller unit 502 and a memory 506. The microcontroller unit 502 can be a CI SC-type (complex instruction set computer) CPU, RISC-type CPU (reduced instruction set computer), a digital signal processor (DSP), a processor, a CPLD (complex programmable logic device) or an FPGA (field programmable gate array).

The memory 506 (which can be memory such as RAM, flash memory, or disk storage) stores one or more software applications (e.g., embedded applications) that, when executed by the microcontroller unit 502, performs any suitable function associated with the device 500.

The microcontroller unit 502 may include memory and logic, which store information frequently accessed from the memory 506. The device 500 includes a circuit 510. In one example, the microcontroller unit 502 may be placed on the same PCB or module as the circuit 510. In another example, the microcontroller unit 502 is external to the device 500. The circuit 510 can function as an analog-to-digital converter. Circuit 510 may include additional analog circuitry, digital circuitry, memory and/or software.

The circuit 510 may include circuitry that is similar, in connection and operation, to the circuit 100 of FIG. 1. The circuit 510 includes a calibration engine, a DAC (digital-to-analog converter), an ADC (analog-to-digital converter), a multiplexer and a storage circuit. The multiplexer receives an input voltage Vin. The ADC includes a preamplifier array, a delay multiplexer and a backend ADC. The preamplifier array includes multiple preamplifiers.

The circuit 510 operates in a calibration mode and a mission mode. In the calibration mode, the calibration engine generates multiple input codes. The DAC generates a first calibration signal in response to a first input code of the multiple input codes. The multiplexer, in calibration mode, provides the first calibration signal to the ADC. The preamplifier array and the delay multiplexer generate a delay signal in response to the first calibration signal. The backend ADC generates a first output code in response to the delay signal. The storage circuit stores the first output code corresponding to the first input code. The storage circuit stores an output code corresponding to each input code of the multiple input codes.

The input code is stored as data and the output code is stored as address. The input code is stored at a corresponding address of the output code. The stored input code includes an index value and a coarse value. The index value is 0 when an input code corresponding to the current output code is equal to an input code corresponding to the previous output code. The coarse value for a current output code is sum of index values generated corresponding to all previous output codes and index value corresponding to the current output code. The coarse value represents running sum of input codes.

The output code includes a total of M and L bits, where both M and L are integers greater than or equal to 1. The output code is reduced to M bits, and the index value is supplemented with L bits. The coarse value is stored for every $2^L$ bits. For example, when the output code is of 15 bits, M is 10 bits and L is 5 bits. The output code is reduced to 10 bits whereas the index value is supplemented by 5 bits. The memory requirement of the look-up table is approximately 45 k ($2^{10}*(32+13)$). Thus, the look-up table requires less memory as compared to conventional solutions and also support high speed operation of the circuit 510. The circuit 510, in one example embodiment, is an ADC, and the look-up table enables the ADC to operate at speeds of GSPS.

Thus, the look-up table in the storage circuit is populated in the calibration mode with the input codes and corresponding output codes. This look-up table is used by the circuit 510 in mission mode. In mission mode, an input voltage Vin (such as a radio frequency analog signal) is received and converted to a digital (e.g. binary) representation via the ADC and the storage circuit. The circuit 510 uses a high-speed ADC and a look table in the storage circuit for conversion of the input voltage Vin which reduces the area and power requirements of the circuit 510. In one example, the device 500 is an RF sampling receiver and circuit 510 enables the device 500 to operate at speeds of GSPS.

Figure 6:
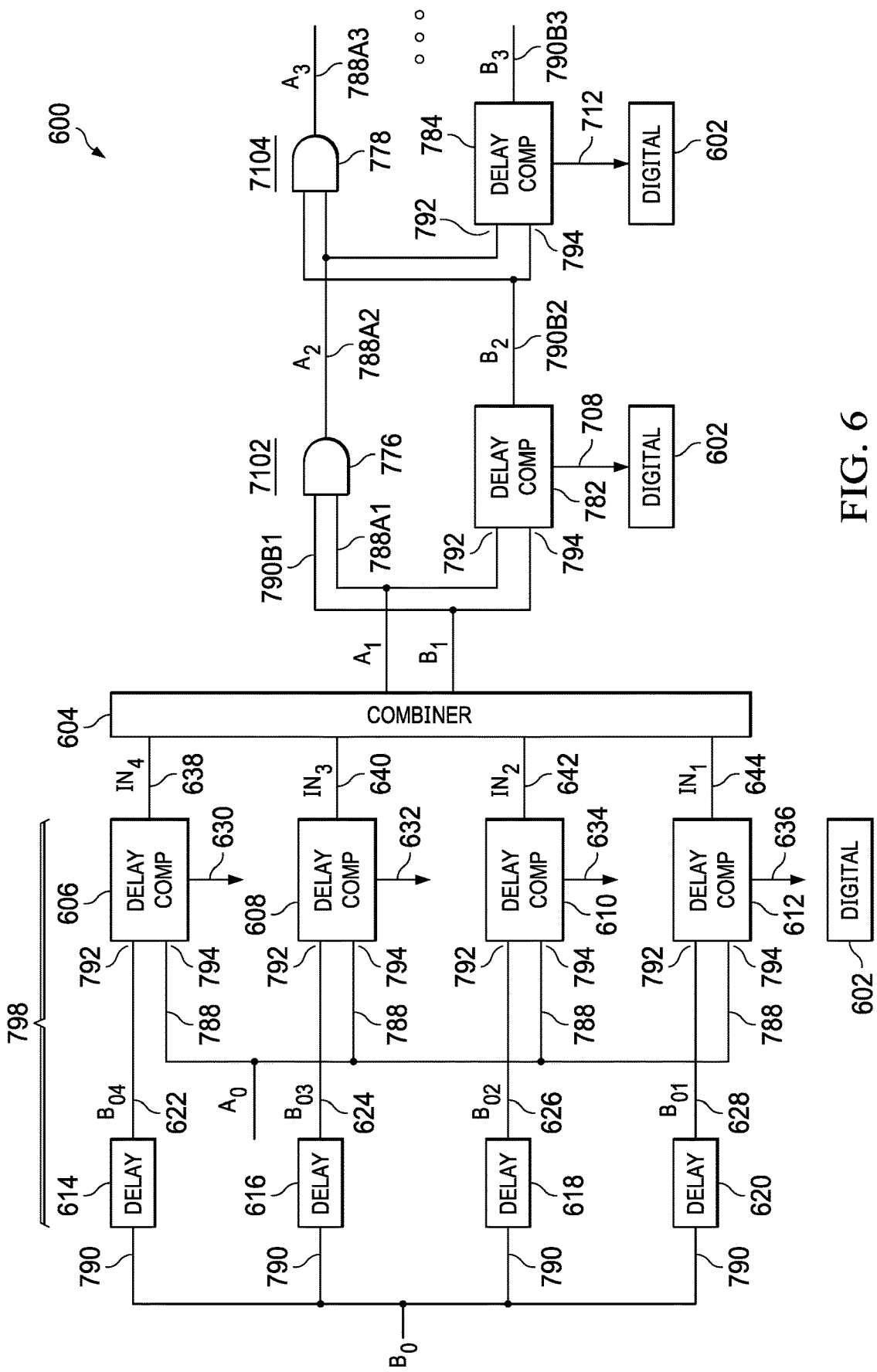
FIG. 6. is a block diagram of a backend analog-to-digital converter, according to an example embodiment.

FIG. 6. is a block diagram of a backend analog-to-digital converter 600, according to an example embodiment. The backend ADC 600 is similar, in connection and operation, to backend ADC 124 illustrated in FIG. 1. The ADC 106 illustrated in FIG. 1 has a frontend and a backend. The frontend may perform a voltage-to-delay function. In one example, the frontend includes a preamplifier array and a delay multiplexer as illustrated in FIG. 1. The backend may perform a delay-to-digital function. According to one aspect of the present disclosure, the frontend of the ADC 106 converts the analog signal Vin received from multiplexer M 112 into delay signals similar to the signals OUT_P and OUT_M generated in FIG. 3. In FIG. 6, these delay signals are represented as A0 and B0 on lines 788 and 790, such that the timings of the delay signals A0 and B0 are representative of the input voltage Vin. The front end, which may be used to generate the delay signals A0 and B0 based on the input voltage Vin, may be constructed and operated, for example, as described in U.S. Pat. No. 10,673,456 (based on U.S. patent application Ser. No. 16/410,698). The frontend may include, for example, a conversion and folding circuit described in U.S. Pat. No. 10,673,456, which includes a voltage-to-delay converter block, including preamplifiers, for converting a voltage signal into delay signals, and a folding block, including logic gates coupled to the preamplifiers, for selecting earlier-arriving and later-arriving ones of the delay signals.

Examples of voltage-to-delay devices which may be incorporated within the frontend of the ADC 106, and used to generate the delay signals A0 and B0 based on the input voltage Vin, are illustrated in U.S. patent application Ser. No. 17/131,981, filed Dec. 23, 2020. A voltage-to-delay device constructed in accordance with U.S. patent application Ser. No. 17/131,981 may have, for example, first and second comparators connected to first and second lines carrying complementary voltages representative of the input voltage Vin, for generating first and second output signals during an active phase when the complementary voltages reach a suitable threshold voltage, such that delay between the output signals is representative of the input voltage Vin. The present disclosure is not limited, however, to the devices and processes described in detail herein. Other suitable devices may perform a suitable voltage-to-delay function within the frontend of the ADC 106. As noted above, the entire disclosures of U.S. Pat. No. 10,673,456 and U.S. patent application Ser. No. 17/131,981 are incorporated herein by reference.

The backend ADC 600 may have, for example, a multi-bit stage 798, and first through i-th single-bit stages 7102 and 7104 connected in series to the multi-bit stage 798. If desired, the backend may have three, four or more than four such single-bit stages (i=3, 4 or more). The single-bit stages 7102 and 7104 illustrated in FIG. 6 are examples of successive non-linear stages. The backend ADC 600 receives the delay signals A0 and B0 from a voltage-to-delay circuit of the frontend. The timings of the delay signals A0 and B0 have a delay which is representative of the input voltage Vin. The backend ADC 600 works with a calibration engine 602 (similar to the calibration engine 102 illustrated in FIG. 1) and a storage circuit (similar to storage circuit 108 illustrated in FIG. 1) to generate a corresponding multi-bit digital code which is generated as final output 130 (FIG. 1). Thus, the final output 130 corresponds to a value which closely approximates the input voltage Vin.

The multi-bit stage 798 may have delay circuits and delay comparators, operated in parallel, for generating M bits of digital information, on lines 630, 632, 634 and 636. In the illustrated example, M=2. However, M may be greater than 2. This disclosure is not limited to the illustrated example. Delay residue from the multi-bit stage 798 may be combined by a combiner 604 and applied to the first single-bit stage 7102. If desired, the first through i-th single-bit stages 7102 and 7104 may be constructed and operated as successive stages, to provide respective bits of digital information to the calibration engine 602.

The first stage 798 may have, for example, four delay comparators 606, 608, 610 and 612, and is connected to the combiner 604. Some example embodiment may be implemented with a first stage which has fewer or more than four delay comparators. In the example embodiment shown in the drawings, the first stage 798 generates two bits of digital information for the calibration engine 602. In the illustrated embodiment, each one of the successive stages 7102 and 7104 generates a single bit of digital information for the calibration engine 602.

In the illustrated example, the leading edge of the signal B0 on line 790 precedes the leading edge of the signal A0 on line 788. The first signal A0 is applied to threshold inputs 794 of the delay comparators 606, 608, 610 and 612. In the illustrated configuration, by way of example, the delay comparators 606, 608, 610 and 612 are essentially identical to each other. The second signal B0 is applied to four different delay circuits 614, 616, 618 and 620 which generate four corresponding signals B04, B03, B02 and B01 on respective lines 622, 624, 626 and 628.

The timings of the corresponding signals B04, B03, B02 and B01 are delayed relative to the timing of the signal B0 on line 790 by different, known amounts each of which is less than or equal to the maximum gain of the frontend. The delayed signals B04, B03, B02 and B01 are applied to first inputs 792 of the respective delay comparators 606, 608, 610 and 612. The first delay comparator 606 issues a sign signal on line 630 representative of which signal (B04 or A0) arrives at the first delay comparator 606 first. Likewise, the second delay comparator 608 issues a sign signal on line 632 representative of which signal (B03 or A0) arrives at the second delay comparator 608 first. Likewise, the third and fourth delay comparators 610 and 612 issue sign signals on lines 634 and 636 representative of which signals arrive at the third and fourth delay comparators 610 and 612 first.

Since the delay circuits 614, 616, 618 and 620 are different from each other, the timings of the leading edges of the delayed signals B04, B03, B02 and B01 are different from each other. Each one of the delay comparators 606, 608, 610 and 612 issues a sign signal, on respective lines 630, 632, 634 and 636, to the calibration engine 602. The sign signals on lines 630, 632, 634 and 636 are functionally related to the difference in timing between the leading edges of the input signals A0 and B0 and are therefore functionally related to the input voltage Vin.

Since the amounts of delay provided by the four delay comparators 606, 608, 610 and 612 are different from each other, the sign signals 630, 632, 634 and 636 provide four binary data points for determining two bits of the output. For example, if B0 precedes A0, and B01 precedes A0, then the calibration engine 602 determines that the delay between the timings of signals A0 and B0 is greater than the delay contributed by the fourth delay circuit 620. Likewise, if B0 precedes A0, and A0 precedes B02, B03 and B04 then the calibration engine 602 determines that the delay between the timings of signals A0 and B0 is less than each of the delays contributed by the third, second and first delay circuits 618, 616 and 614.

If desired, the structure and operation of the delay comparators 606, 608, 610 and 612 may be the same as those of a delay comparator 782 described below. In operation, the delay comparators 606, 608, 610 and 612 generate respective delay signals IN4, IN3, IN2 and IN1 on respective output lines 638, 640, 642 and 644. The delay signals IN4, IN3, IN2 and IN1 are applied to the combiner 604 by the output lines 638, 640, 642 and 644. In the illustrated configuration, the delay circuits 614, 616, 618 and 620 are different from each other and contribute different amounts of delay, while the delay comparators 606, 608, 610 and 612 are essentially the same. Therefore, the timings of the leading edges of the delay signals IN4, IN3, IN2 and IN1 are different from each other.

Figure 7:
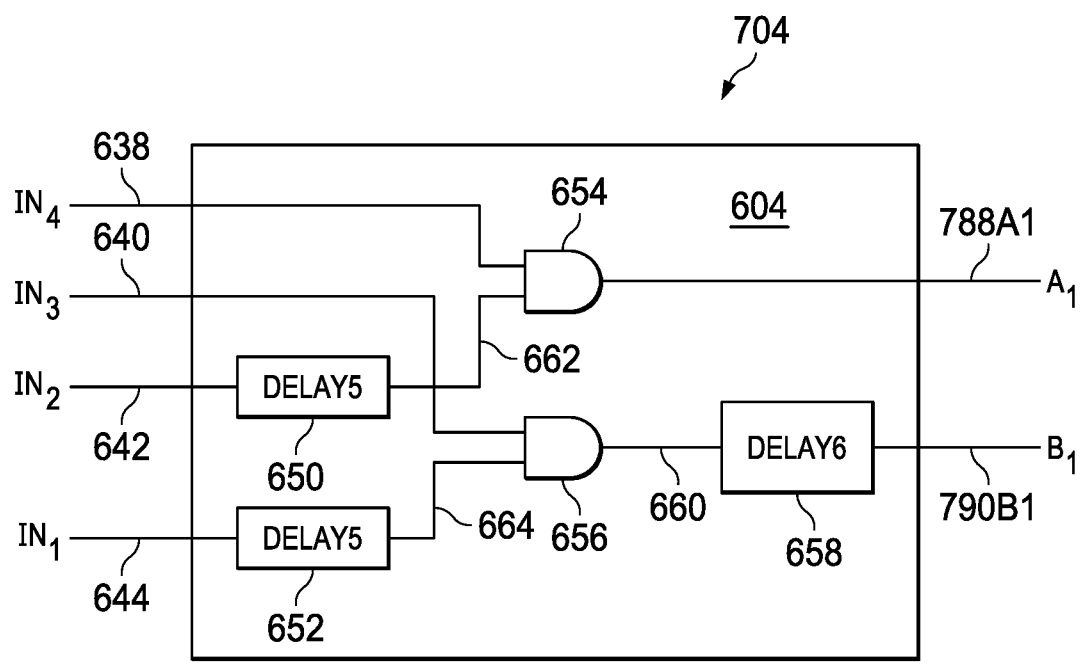
FIG. 7 is a block diagram of a combiner for connecting a multi-bit stage shown in FIG. 6 to a first one of single-bit stages, according to an example embodiment.

FIG. 7 is a block diagram of a combiner 604 for connecting a multi-bit stage shown in FIG. 6 to a first one of single-bit stages, according to an example embodiment. The combiner 604 is similar, in connection and in operation, to the combiner 604 illustrated in FIG. 6. The combiner 604 has two fifth delay circuits 650 and 652, two AND gates 654 and 656, and a sixth delay circuit 658. In the illustrated configuration, the fifth delay circuits 650 and 652 are essentially identical to each other. However, this disclosure is not limited to the details of the configurations shown and described herein. The third and fourth delay signals IN2 and IN1 are applied to the fifth delay circuits 650 and 652, on output lines 642 and 644, and the first and second delay signals IN4 and IN3 are applied to the AND gates 654 and 656, on output lines 638 and 640. Output signals from the fifth delay circuits 650 and 652 are also applied to the AND gates 654 and 656, on conductive lines 662 and 664, respectively. An output signal from one of the AND gates 656 is applied to the sixth delay circuit 658, on a conductive line 660, and the other AND gate 654 generates a signal A1 on conductive line 788A1. The sixth delay circuit 658 generates a signal B1 on conductive line 790B1.

In operation, the timings of the leading edges of the signals output from the fifth and sixth delay circuits 650, 652 and 658 on conductive lines 662, 664 and 790B1, are delayed relative to the respective timings of the leading edges of the signals input to the delay circuits 650, 652 and 658. The timings of the leading edges of signals output from the AND gates 654 and 656, on lines 788A1 and 660, correspond to the respective timings of the later-arriving of the signals input to the AND gates 654 and 656. The relative timing of the leading edges of the signals A1 and B1 on lines 788A1 and 790B1 is functionally (that is, predictably) related to the input voltage Vin (FIG. 1). In other words, the delay circuits 650, 652 and 658 and the logic gates 654 and 656 establish a transfer function between the delay of the incoming signals IN4, IN3, IN2 and IN1 and the delay of the first and second signals A1 and B1.

For the illustrated configuration, the transfer function is as follows: [A] if the timing of the signal on line 638 precedes the timing of the signal on line 662 (where the timing of the signal on line 662 corresponds to the timing of the signal on line 642 delayed by the fifth delay circuit 650), then the timing of the signal on line 788A1 corresponds to the timing of the signal on line 662, but if the timing of the signal on line 662 precedes the timing of the signal on line 638, then the timing of the signal on line 788A1 corresponds to the timing of the signal on line 638; [B] if the timing of the signal on line 640 precedes the timing of the signal on line 664 (where the timing of the signal on line 664 corresponds to the timing of the signal on line 644 delayed by the fifth delay circuit 652), then the timing of the signal on line 660 corresponds to the timing of the signal on line 664, but if the timing of the signal on line 664 precedes the timing of the signal on line 640, then the timing of the signal on line 660 corresponds to the timing of the signal on line 640; and [C] the timing of the signal on line 790B1 corresponds to the timing of the signal on line 660 delayed by the sixth delay circuit 658.

The amounts by which the delay circuits 650, 652 and 658 delay the signals transmitted through them may be selected to maximize or improve the gain of the first and second signals A1 and B1 to the extent practicable. The combiner 604 operates in delay mode, where gain relates to delay (not voltage). If the gain of the first and second signals A1 and B1 is too low, meaning that the timings of the first and second signals A1 and B1 are too close to each other, then the information represented by the relative timing of those signals may be difficult to resolve.

One aspect of the present disclosure is that the timings of the signals on lines 788A1 and 790B1 are functionally (that is, predictably) related to the timings of the signals on lines 638, 640, 642 and 644. If a certain set of signal timings on lines 638, 640, 642 and 644 results in a first set of signal timings on lines 788A1 and 790B1, the same first set of signal timings on lines 788A1 and 790B1 may be expected to occur whenever the same set of signal timings occurs on lines 638, 640, 642 and 644. Likewise, if another set of signal timings on lines 638, 640, 642 and 644 results in a second set of signal timings on lines 788A1 and 790B1, the same second set of signal timings on lines 788A1 and 790B1 may be expected to occur whenever the other set of signal timings occurs on lines 638, 640, 642 and 644. And since the timings of the signals on lines 638, 640, 642 and 644 are functionally (that is, predictably) related to the input voltage Vin, the timings of the signals on lines 788A1 and 790B1 are also functionally related to the input voltage Vin.

Referring again to FIG. 6, the signals A1 and B1 generated by the combiner 604 (similar to combiner 604 in FIG. 7) are applied to the second stage 7102 on the output lines 788A1 and 790B1 which are similar to the lines 788A1 and 790B1 (of FIG. 7) respectively. The second stage (which is a first residual stage) 7102 is coupled to the first stage 798 (through the combiner 604), and the i-th stage 7104 (which is a second residual stage in the illustrated example) is coupled to the second stage 7102.

In the illustrated example, the second through i-th stages 7102 and 7104 each include AND gates (such as AND gate 776 for stage 7102 and AND gate 778 for stage 7104) and delay comparators (such as delay comparator 782 for stage 7102 and delay comparator 784 for stage 7104). The illustrated AND gates are merely examples, however, of logic gates that may be employed according to this disclosure. If desired, this disclosure may be implemented with or without AND gates and/or with or without gates other than AND gates.

Further, in the illustrated configuration, the AND gates 776 and 778 may be essentially identical to each other, and the delay comparators 782 and 784 may be essentially identical to each other. The conductive output lines 788A1 and 790B1 from the combiner 604 are coupled to inputs of the first AND gate 776 and delay comparator 782. Specifically, the conductive line 788A1 is coupled to a first input 792 of the delay comparator 782, and the conductive line 790B1 is coupled to a threshold input 794 of the delay comparator 782.

An output line 788A2 from the AND gate 776 is electrically coupled to one of the inputs of the AND gate 778, and to the input 792 of the delay comparator 784. A conductive line 790B2 from the first delay comparator 782 is electrically coupled to the other one of the inputs of the AND gate 778, and to the threshold input 794 of the delay comparator 784. The pattern created by the second and third stages 7102 and 7104 may be continued for as many additional stages as desired. Each successive stage has an AND gate and a delay comparator essentially identical to the AND gates and the delay comparators of the second and third stages 7102 and 7104, and is electrically coupled to the AND gate and delay comparator of a preceding stage in the same way.

In operation, signals AN and BN (where N=1, 2, 3 ... for stages 7102 and 7104 ... respectively) are applied to respective ones of the AND gates 776 and 778, causing the AND gates 776 and 778 to generate corresponding signals AN+1. For each one of the AND gates 776 and 778, the timing of the leading edge of signal AN+1 tracks the timing of the leading edge of the later-arriving of signals AN and BN. In particular, for each one of the AND gates 776 and 778, the timing of the leading edge of signal AN+1 is equal to the timing of the leading edge of the earlier-arriving of signals AN and BN plus an amount of time that is related to the extent to which the leading edge of the later-arriving of signals AN and BN lags behind the leading edge of the earlier-arriving of signals AN and BN.

Figure 8:
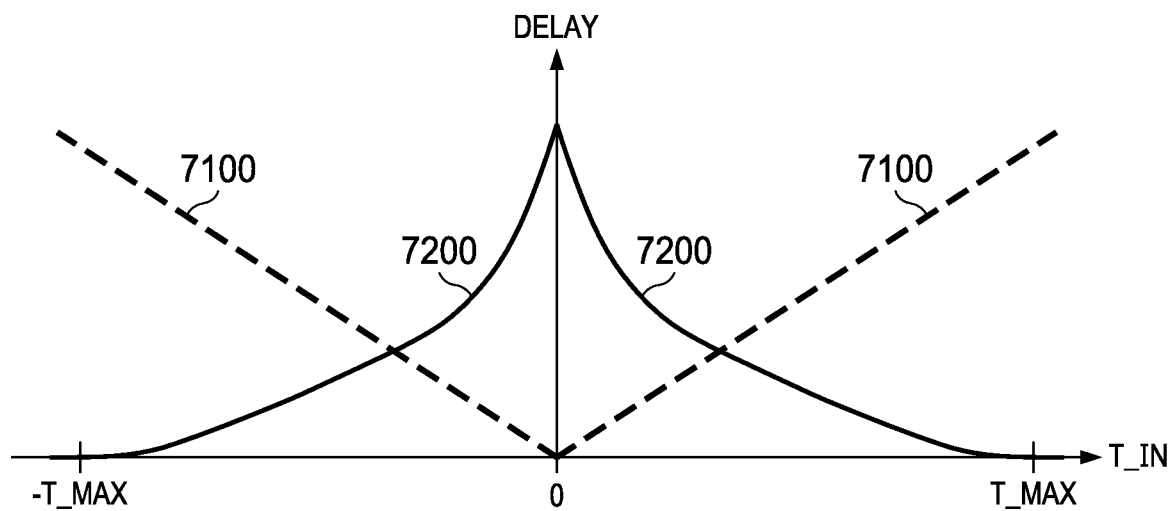
FIG. 8 is a graph which illustrates AND-gate delay and comparator delay generated by an AND gate and a delay comparator, respectively, of the backend ADC of FIG. 6, where the AND-gate delay and the comparator delay are functions of input-signal delay, according to an example embodiment.

FIG. 8 is a graph which illustrates AND-gate delay and comparator delay generated by an AND gate and a delay comparator, respectively, of the backend ADC of FIG. 6, where the AND-gate delay and the comparator delay are functions of input-signal delay, according to an example embodiment. The graph includes an X-axis (T_IN) and a Y-axis (Output Delay). The AND-gate (for example the AND gates 776, 778) delay and the comparator (for example the delay comparators 782, 784) delay are functions of input-signal delay, according to an example embodiment. The input-signal delay is delay between the signals received by the AND gate or by the delay comparator. As illustrated, the AND-gate delay 7100 contributed by a respective AND gate is linearly related to the absolute value of an input-signal delay T_IN, where the input-signal delay T_IN is the difference in timing between signals AN and BN input into the respective AND gate, where N is an integer and N is equal to 1 for the stage 7102 and N is equal to 2 for the stage 7104. In the illustrated configuration, the relationship of the AND gate delay 7100 to the input-signal delay T_IN is linear regardless of whether AN or BN leads or follows.

Signals AN and BN are also applied to the inputs 792 and threshold inputs 794, respectively, of the delay comparators 782 and 784, causing the delay comparators 782 and 784 to generate corresponding signals BN+1. For each one of the delay comparators 782 and 784, the timing of the leading edge of signal BN+1 tracks the timing of the leading edge of the earlier-arriving of signals AN and BN. In particular, for each one of the delay comparators 782 and 784, the timing of the leading edge of signal BN+1 is equal to (1) the timing of the leading edge of the earlier-arriving of signals AN and BN plus (2) a comparator delay 7200 that is logarithmically inversely related to the absolute value of the input-signal delay T_IN (in other words, comparator delay is greater for input values that are more similar—if the difference between the two inputs to the comparator is greater, the comparator delay is less).

Figure 9:
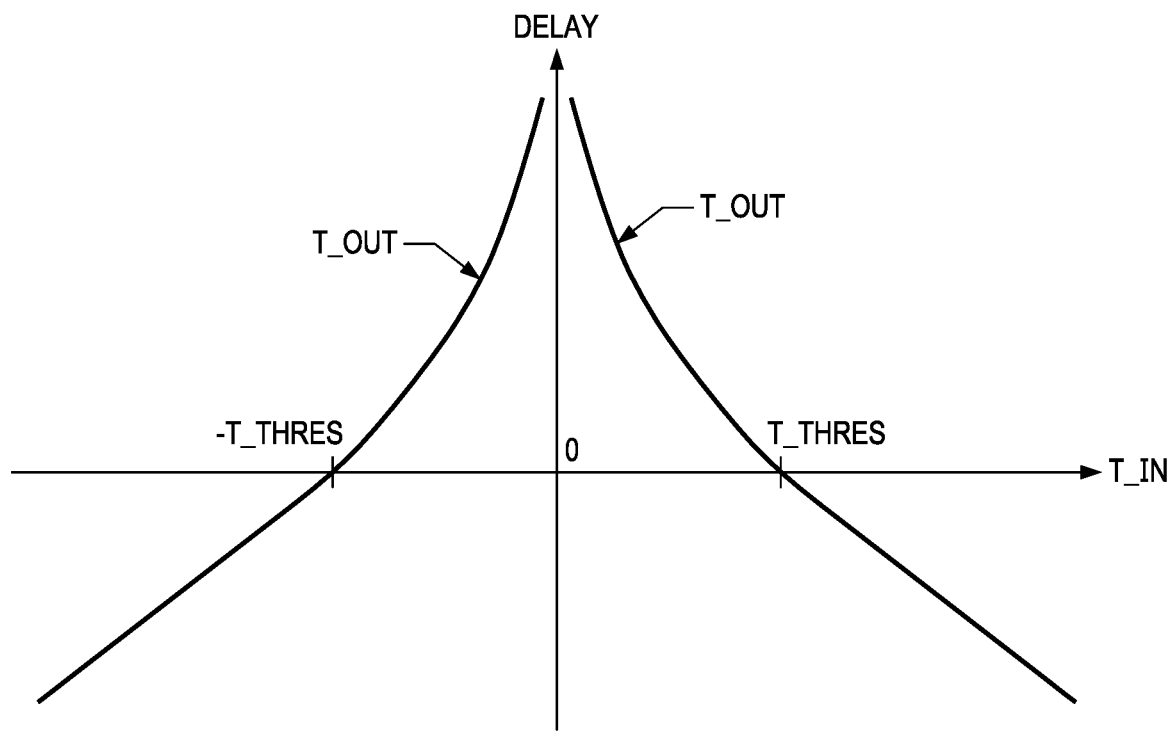
FIG. 9 is a graph which illustrates output-signal delay as a function of the input-signal delay of FIG. 8, according to an example embodiment.

FIG. 9 is a graph which illustrates output-signal delay as a function of the input-signal delay of FIG. 8, according to an example embodiment. Subtracting the AND gate-delay 7100 from the comparator delay 7200 yields the output-signal delay T_OUT for any given single-bit stage 7102 and 7104. When the absolute value of the input-signal delay T_IN is less than a threshold delay T_THRES, then the output-signal delay T_OUT is a positive value (meaning that the leading edge of signal BN+1 generated by the respective delay comparator 782 and 784 precedes the leading edge of signal AN+1 generated by the respective AND gate 776 and 778). On the other hand, when the absolute value of the input-signal delay T_IN is greater than the threshold delay T_THRES, then the output-signal delay T_OUT is a negative value (meaning that the leading edge of signal BN+1 lags behind the leading edge of corresponding signal AN+1). The positive or negative character of the output-signal delay T_OUT is reported to the calibration engine 602 on the signal line of the successive delay comparator.

In operation, the first delay comparator 782 issues a first sign signal ("1" or "0") on digital line 708 (an example of a digital output) to the calibration engine 602. The first sign signal (an example of a digital signal in accordance with this disclosure) is based on which one of the leading edges of signals A1 and B1 is first received by the first delay comparator 782, such that the first sign signal reflects the order of the leading edges of signals A1 and B1 applied to the first input 792 and threshold input 794 of the delay comparator 782. The AND gate 776 and the delay comparator 782 generate signals A2 and B2 which are applied to the AND gate 778 and the delay comparator 784 of the third stage 7104. The delay comparator 784 outputs a second sign signal ("1" or "0") on a second digital line 712 to the calibration engine 602. The second sign signal is based on which one of the leading edges of the signals A2 and B2 is first received by the second delay comparator 784, such that the second sign signal reflects the order of the leading edges of the signals A2 and B2 applied to the inputs 792 and 794 of the second delay comparator 784.

Since the delay between signals A1 and B1 can be predicted as a function of the input voltage Vin, and vice versa, and since the delay between the signals AN+1 and BN+1 output by a successive stage can be predicted as a function of the signals AN and BN received from the preceding stage, and vice versa, the sign signals output by the delay comparators of the cascade of stages can be predicted as a function of the input voltage Vin, and vice versa. Therefore, a code made up of the sign signals may be reliably compared to a predetermined correlation to determine an approximation of the input voltage Vin. In operation, the timings of the signals on lines 788A1 and 790B1 are functionally (that is, predictably) related to the timings of the signals on lines 788 and 790, as discussed above. The timings of the signals on lines 788A2 and 790B2 are functionally (that is, predictably) related to the timings of the signals on lines 788A1 and 790B1. The timings of the signals on lines 788A3 and 790B3 are functionally (that is, predictably) related to the timings of the signals on lines 788A2 and 790B2, and so on.

Moreover, where a certain set of signal timings on lines 788 and 790 results in a first set of signal timings on lines 788A1, 790B1, 788A2, 790B2, 788A3, 790B3, and so on, the same first set of signal timings on lines 788A1, 790B1, 788A2, 790B2, 788A3, 790B3, and so on may be expected to occur whenever the same set of signal timings occurs on lines 788 and 790. Likewise, if another, different set of signal timings on lines 788 and 790 results in a second set of signal timings on lines 788A1, 790B1, 788A2, 790B2, 788A3, 790B3, and so on, the same second set of signal timings on lines 788A1, 790B1, 788A2, 790B2, 788A3, 790B3, and so on may be expected to occur whenever the other set of signal timings occurs on lines 788 and 790. And since the timings of the signals on lines 788 and 790 are functionally (that is, predictably) related to the input voltage Vin, the timings of the signals on lines 788A1, 790B1, 788A2, 790B2, 788A3, 790B3, and so on, which determine the sign signals used to make up the output code, are also functionally related to the input voltage Vin.

Figure 10:
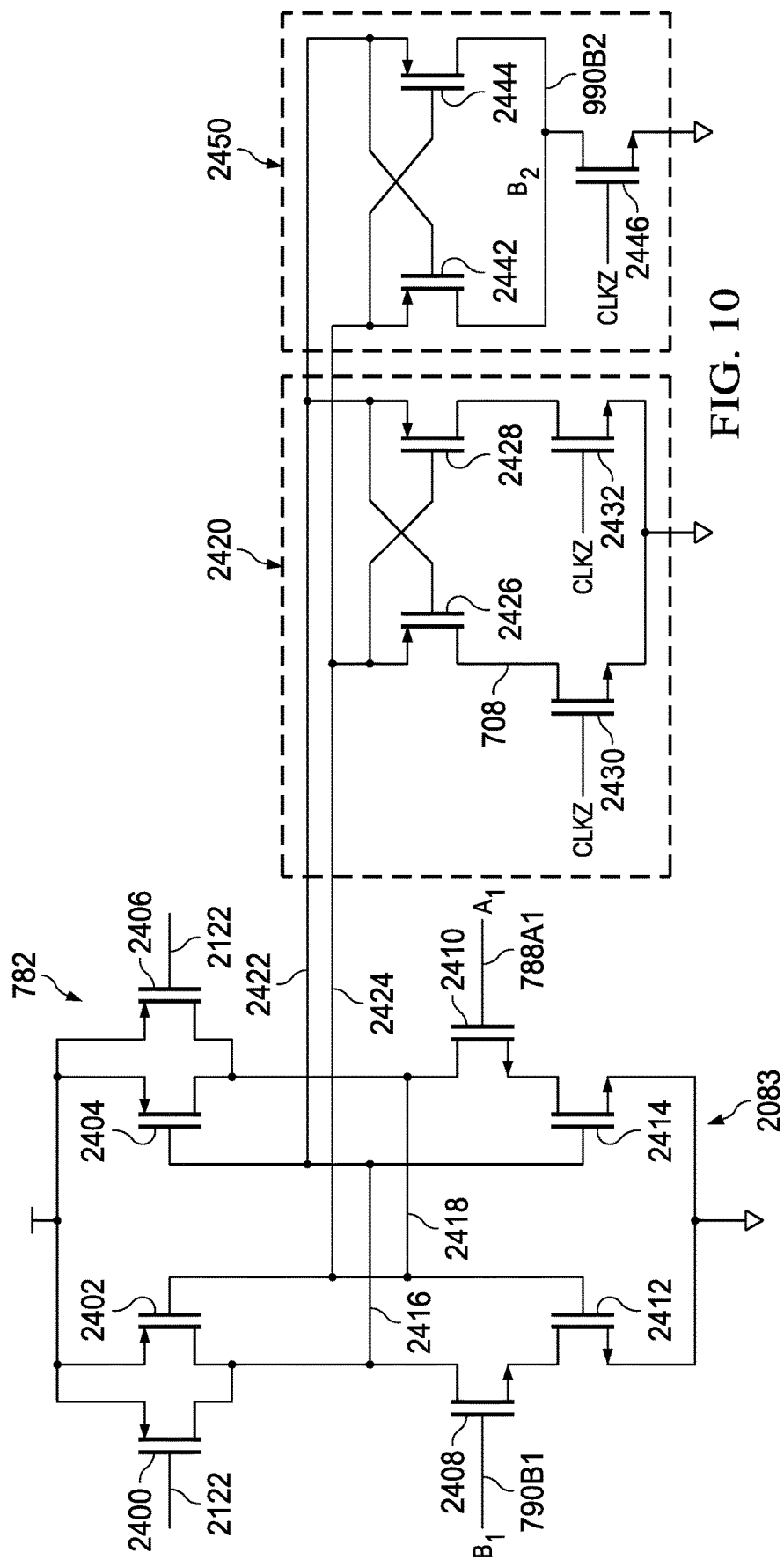
FIG. 10 is a circuit diagram of an example of a comparator circuit merged with sign-out and delay-out circuits for the backend ADC of FIG. 6, according to an example embodiment.

FIG. 10 is a circuit diagram of an example of a comparator circuit merged with sign-out and delay-out circuits for the backend ADC of FIG. 6, according to an example embodiment. The delay comparator 782 has a comparator circuit 2083 which has first, second, third, fourth, fifth, sixth, seventh, and eighth transistors 2400, 2402, 2404, 2406, 2408, 2410, 2412 and 2414, In the illustrated example, the timing of the delay comparator 782 is controlled by a signal from a clock (CLK) applied to the gates of the first and fourth transistors 2400, 2406, on a conductive line 2122. The first and second signals A1, B1 on lines 788A1 and 790B1 are applied to the gates of the sixth and fifth transistors 2410 and 2408, respectively. The drains of the first, second, and fifth transistors 2400, 2402 and 2408 are electrically connected to each other, and to the gates of the third and eighth transistors 2404 and 2414, via a first conductive line 2416. The drains of the third, fourth, and sixth transistors 2404, 2406 and 2410 are likewise electrically connected to each other, and to the gates of the second and seventh transistors 2402 and 2412, via a second conductive line 2418.

The first and second conductive lines 2416 and 2418 of the comparator circuit 2083 are electrically connected to a sign-out circuit 2420 via respective third and fourth conductive lines 2422 and 2424. As illustrated, the sign-out circuit 2420 is merged with the comparator circuit 2083. The sign-out circuit 2420 has first, second, third and fourth transistors 2426, 2428, 2430 and 2432. The third conductive line 2422 is electrically connected to the gate and the source of the first and second transistors 2426 and 2428 of the sign-out circuit 2420, respectively, while the fourth conductive line 2424 is electrically connected to the source and the gate of the first and second transistors 2426 and 2428 of the sign-out circuit 2420, respectively.

In operation, when the delay comparator 782 is enabled by the clock signal on line 2122, a sign signal is generated within the sign-out circuit 2420 on line 708. The sign signal is forwarded to the calibration engine 602 on line 708, and represents the order in which the output signals A1 and B1 arrive at the first and threshold inputs 792 and 794 of the delay comparator 782. The operation of the sign-out circuit 2420 is controlled by an inverted clock signal CLKZ applied to the gates of the third and fourth transistors 2430 and 2432 of the sign-out circuit 2420. The inverted clock signal CLKZ is an inverted version of the clock signal that is applied to the gates of the first and fourth transistors 2400 and 2406 of the comparator circuit 2083 on line 2122.

The third and fourth conductive lines 2422 and 2444 are also electrically connected to a delay-out circuit 2450. As illustrated, the delay-out circuit 2450 is merged with the comparator circuit 2083. The delay-out circuit 2450 has first, second and third transistors 2442, 2444 and 2446. The third conductive line 2422 is electrically connected to the gate and the source of the first and second transistors 2442 and 2444 of the delay-out circuit 2450, respectively, while the fourth conductive line 2424 is electrically connected to the source and the gate of the first and second transistors 2442 and 2444 of the delay-out circuit 2450, respectively.

In operation, a delay signal B2 is generated on line 790B2 which is electrically connected to the drains of both of the first and second transistors 2442 and 2444 of the delay-out circuit 2450. The timing of the leading edge of the delay signal B2 on line 790B2 relative to the timing of the earlier-arriving of the leading edges of the signals A1 and B2 on inputs 792 and 794 is the comparator delay 7102. The operation of the delay-out circuit 2450 is controlled by the same inverted clock signal CLKZ that is applied to the third and fourth transistors 2430, 2432 of the sign-out circuit 2420. The inverted clock signal CLKZ is applied to the gate of the third transistor 2446 of the delay-out circuit 2450. The drain of the third transistor 2446 of the delay-out circuit 2450 is electrically connected to the drains of the first and second transistors 2442, 2444 of the delay-out circuit 2450.

The term "couple" is used throughout. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs). While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described embodiments, and other embodiments are possible, within the scope of the claims.

What is claimed is:

1. A circuit comprising:
    a multiplexer configured to receive an input voltage and a calibration signal;
    an analog-to-digital converter (ADC) coupled to the multiplexer and configured to generate an output code in response to the calibration signal; and
    a storage circuit coupled to the ADC and configured to store an input code representative of the calibration signal at an address corresponding to the output code, the stored input code includes an index value and a coarse value;
    wherein the index value is 1 when an input code corresponding to a current output code is not equal to an input code corresponding to a previous output code, and the index value is 0 when an input code corresponding to the current output code is equal to an input code corresponding to the previous output code.

2. The circuit of claim 1 further comprising:
a calibration engine coupled to the storage circuit and the ADC, the calibration engine configured to generate a plurality of input codes; and
a digital-to-analog converter (DAC) coupled to the calibration engine, and configured to generate the calibration signal in response to an input code of the plurality of input codes.

3. The circuit of claim 1, wherein the output code is stored as address and the input code is stored as data.

4. The circuit of claim 1, wherein a coarse value for a current output code is sum of index values generated corresponding to all previous output codes and index value generated corresponding to the current output code.

5. The circuit of claim 1, wherein the output code includes M bits and L bits.

6. The circuit of claim 5 wherein when output code is reduced to M bits and the index value is supplemented with L bits, the coarse value is stored for every 2^L bits.

7. The circuit of claim 1, wherein the ADC further comprises:
a plurality of preamplifiers, each preamplifier configured to compare one of an input voltage and the calibration signal to a threshold voltage;
a delay multiplexer coupled to the plurality of preamplifiers and configured to generate a delay signal based on an output of one of the preamplifiers; and
a backend ADC configured to generate the output code in response to the delay signal;
wherein the circuit is configured to operate in a mission mode, wherein when in the mission mode:
the multiplexer is configured to provide the input voltage to the ADC; and
the ADC is configured to generate a raw code in response to the input voltage, wherein an input code stored at an address corresponding to the raw code is generated as a final output.

8. The circuit of claim 7, wherein each preamplifier has a different threshold voltage.

9. A method comprising:
receiving an input voltage and a calibration signal;
generating an output code by an analog-to-digital converter (ADC) in response to the calibration signal;
storing an input code representative of the calibration signal at an address corresponding to the output code, the stored input code includes an index value and a coarse value;
storing the index value as 1 when there is a current output code is not equal to a previous output code; and
storing the index value as 0 when the current output code is equal to the previous output code.

10. The method of claim 9 further comprising:
providing the input voltage to the ADC;
generating a raw code by the ADC in response to the input voltage; and
generating an input code stored at an address corresponding to the raw code as a final output.

11. The method of claim 9 further comprising summing all index values generated corresponding to all previous output codes to obtain a coarse value for a current output code.

12. The method of claim 9 further comprising:
generating a plurality of input codes; and
generating a calibration signal by a digital-to-analog converter (DAC) in response to an input code of the plurality of input codes.

13. The method of claim 9 further comprising storing the output code as address and storing the input code as data.

14. The method of claim 9, wherein the output code includes M bit and L bits.

15. The method of claim 14 further comprising:
reducing the output code to M bits;
supplementing the index value with L bits; and
storing the coarse value for every 2^L bits.

* * * * *